(12) United States Patent
Inoguchi et al.

(10) Patent No.: US 11,519,943 B2
(45) Date of Patent: Dec. 6, 2022

(54) MULTI WIRE BONDING WITH CURRENT SENSING METHOD

(71) Applicant: SEMICONDUCTOR COMPONENTS INDUSTRIES, LLC, Phoenix, AZ (US)

(72) Inventors: Hiroshi Inoguchi, Tatebayashi (JP); Takashi Nagashima, Sano (JP); Masaru Maeda, Ota (JP)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 17/089,842

(22) Filed: Nov. 5, 2020

(65) Prior Publication Data

US 2022/0137102 A1    May 5, 2022

(51) Int. Cl.
| | |
|---|---|
| *G01R 19/00* | (2006.01) |
| *H01L 23/495* | (2006.01) |
| *H01L 25/16* | (2006.01) |
| *H01L 23/00* | (2006.01) |
| *H01L 21/66* | (2006.01) |

(52) U.S. Cl.
CPC .......... *G01R 19/0092* (2013.01); *H01L 22/14* (2013.01); *H01L 23/49575* (2013.01); *H01L 24/45* (2013.01); *H01L 24/48* (2013.01); *H01L 24/49* (2013.01); *H01L 24/85* (2013.01); *H01L 25/16* (2013.01); *H01L 2224/45124* (2013.01); *H01L 2224/45144* (2013.01); *H01L 2224/48245* (2013.01); *H01L 2224/49112* (2013.01); *H01L 2224/49505* (2013.01)

(58) Field of Classification Search
CPC ... H01L 22/14; H01L 23/49575; H01L 24/45; H01L 24/48; H01L 24/49; H01L 24/85
See application file for complete search history.

(56) References Cited

U.S. PATENT DOCUMENTS

| | | | |
|---|---|---|---|
| 2014/0184303 A1 | 7/2014 | Hasegawa et al. | |
| 2020/0408182 A1* | 12/2020 | Taguchi | F02P 3/0556 |
| 2021/0217741 A1* | 7/2021 | Ishimatsu | H01L 23/49503 |

FOREIGN PATENT DOCUMENTS

| | | |
|---|---|---|
| JP | 2012018025 | 1/2012 |
| WO | WO2018207856 | 5/2020 |

* cited by examiner

*Primary Examiner* — Marc Anthony Armand
(74) *Attorney, Agent, or Firm* — Adam R. Stephenson, Ltd.

(57) ABSTRACT

Implementations of a semiconductor package system may include a first bond wire bonded to a portion of a leadframe and to a pad of a semiconductor die, the first bond wire coupled to one of a power source or a ground; and a second bond wire bonded to the portion of the leadframe and to a control integrated circuit. The portion of the leadframe may form a current sense area and the control integrated circuit may be configured to use the second bond wire and the current sense area to measure a current flowing through the first bond wire during operation.

17 Claims, 4 Drawing Sheets

MULTI WIRE BONDING WITH CURRENT SENSING METHOD

BACKGROUND

1. Technical Field

Aspects of this document relate generally to semiconductor packages, such as packages for semiconductor die. More specific implementations involve packages for power semiconductor devices.

2. Background

Semiconductor packages are used to protect various semiconductor devices and other components during operation. Semiconductor packages allow for shielding of semiconductor devices from various environmental conditions like relative humidity temperature and provide for electrical insulation of various components.

SUMMARY

Implementations of a semiconductor package system may include a first bond wire bonded to a portion of a leadframe and to a pad of a semiconductor die, the first bond wire coupled to one of a power source or a ground; and a second bond wire bonded to the portion of the leadframe and to a control integrated circuit. The portion of the leadframe may form a current sense area and the control integrated circuit may be configured to use the second bond wire and the current sense area to measure a current flowing through the first bond wire during operation.

Implementations of a semiconductor package system may include one, all, or any of the following:

The system may include at least a third bond wire bonded to the portion of the leadframe and to the pad.

The semiconductor die may be an insulated gate bipolar transistor.

The first bond wire may include aluminum.

The second bond wire may include gold.

The third bond wire may include aluminum.

The junction temperature between the pad and the first bond wire and the at least third bond wire may be reduced by dividing the total current with the first bond wire and the at least third bond wire.

Implementations of a semiconductor package system may include a first bond wire bonded to a portion of a substrate and to a pad of a semiconductor die, the first bond wire coupled to one of a power source or a ground; and a second bond wire bonded to the portion of the substrate and configured to be bonded to a control integrated circuit. The portion of the substrate may form a current sense area configured to allow the control integrated circuit to use the second bond wire and the current sense area to measure a current flowing through the first bond wire during operation.

Implementations of a semiconductor package system may include one, all, or any of the following:

The system may include at least a third bond wire bonded to the portion of the substrate and to the pad.

The semiconductor die may be an insulated gate bipolar transistor.

The first bond wire may include aluminum.

The second bond wire may include gold.

The third bond wire may include aluminum.

The junction temperature between the pad and the first bond wire and the at least third bond wire may be reduced by dividing the total current with the first bond wire and the at least third bond wire.

In various implementations of a method of current sensing in a semiconductor package the method may include bonding a first bond wire to a portion of one of a substrate or a leadframe, to a pad of a semiconductor die and to one of a power source or a ground; bonding a second bond wire to the portion of the one of the substrate or the leadframe and to a control integrated circuit; and measuring a current flowing through the first bond wire using the control integrated circuit, the second bond wire, and the current sense area.

Implementations of a method of current sensing in a semiconductor package may include one, all, or any of the following:

The method may include bonding at least a third bond wire to the portion of the substrate and to the pad.

The semiconductor die may be an insulated gate bipolar transistor.

The first bond wire and the third bond wire may include aluminum.

The second bond wire may include gold.

The method may include reducing a junction temperature between the pad and the first bond wire and the at least third bond wire by dividing the total current between the first bond wire and the at least third bond wire.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor package will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

Figure 1:
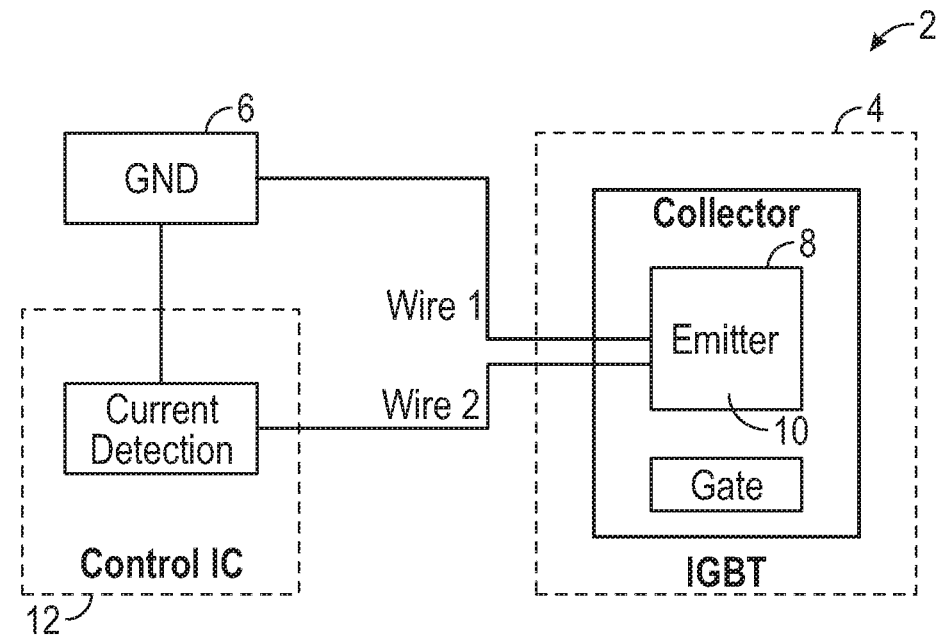
FIG. 1 is a block diagram of a first implementation of a semiconductor package.

Referring to FIG. 1, a block diagram of a first implementation of a semiconductor package 2 is illustrated. As illustrated, this package is designed for use with an insulated gate bipolar transistor (IGBT). Along with the IGBT in the package is a control integrated circuit (IC) is designed to measure how much current is passing through Wire 1 from the emitter 8 to the package ground 6. In this implementation, the current detection is accomplished by bonding Wire 2 with the same emitter pad 10 that Wire 1 is bonded to and using the control IC 12 to measure the current flowing from the emitter pad 10 to the ground via Wire 2. During operation of semiconductor package implementations with a structure similar to that illustrated in FIG. 1, it has been noted that the ability to measure the current is determined by the distance between the locations on the emitter pad 10 at which Wire 1 and Wire 2 are physically bonded to the emitter pad 10. Over time, the surface resistance of the pad material has been observed to increase as the material of the pad degrades after many thermal cycles. This affect is also been noted even when the material of the emitter pad 10 is aluminum and the material of Wire 1 is aluminum.

In various implementations of semiconductor packages with a structure like that illustrated in FIG. 1, a junction temperature (Tj) measured in the emitter pad 10 region for each of Wire 1 and Wire 2 between the material of the wire and the material of the emitter pad 10 also increases over time because of current duty through the joints during operation. Given a sufficiently long period of time, the increasing junction temperature has been observed to eventually result in the destruction of the joint between the aluminum material of Wire 1 and the material of the emitter pad 10. When this occurs, a package short/open condition is detected.

Figure 2:
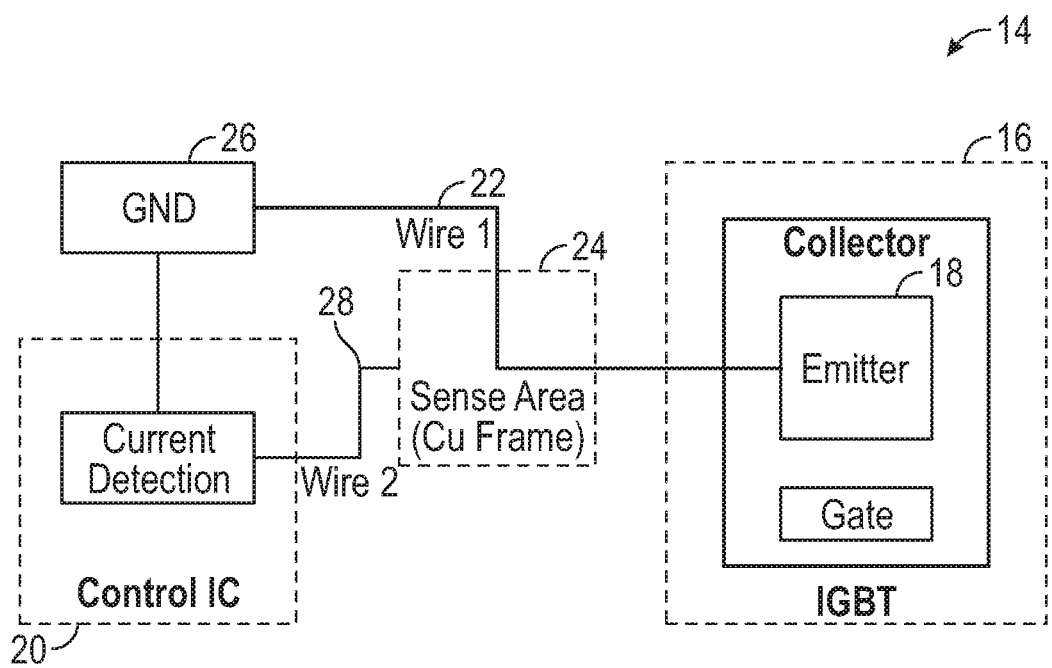
FIG. 2 is a block diagram of a second implementation of a semiconductor package.

Referring to FIG. 2, a block diagram of a second implementation 14 of a semiconductor package is illustrated. As in the implementation illustrated FIG. 1, this package includes an IGBT 16 with an emitter pad 18 and a control IC 20. A first wire 22 is bonded to the emitter pad 18 and to a location on a portion of a leadframe 24 to which the IGBT and control IC are coupled. In various implementations, the portion of the leadframe 24 may be referred to as a current sensing/sense area of the leadframe. While the use of the leadframe is illustrated in the package implementation of FIG. 2, in other implementations, a substrate may be used to couple the IGBT 16 and the control IC 20. In various implementations, a wide variety of substrate types may be employed including, by non-limiting example, ceramic substrates, direct bonded copper substrates, integrated metal substrates, laminated substrates, or any other substrate type used in semiconductor packages.

As illustrated in FIG. 2, the first wire 22 is bonded in 3 different places—first at the ground 26, second at the sense area 24, and third at the emitter pad 18. This results in the first wire 22 having triple bonding points or being triply bonded. Because the first wire 22 is bonded to the sense area 24, the second wire 28 is bonded between the sense area 24 and the control IC 20 and does not have to be bonded directly to the emitter pad 18. This is because in this implementation the sense area 24 is electrically conductive and permits a circuit to be formed with the control IC via the second wire 28. The control IC 20 is now able to directly measure the amount of current flowing through the first wire 22 from the emitter pad 18 to the ground 26 by using the sense area 24.

In this design, the issue of increasing surface resistance of the material of the emitter pad 18 is essentially eliminated because the current sensing/measuring now is done away from the emitter pad 18 itself using the material of the leadframe. The structure avoids involving the material of the emitter pad 18 and the current sensing process at all. Instead of using the distance between Wire 1 and Wire 2 as part of the process of calculating the current passing through Wire 1, the distance along the first wire 22 between the current sense area 24 and the ground 26 is used in the calculations by the control IC 20. This distance along the first wire 22 and control IC 20 is controlled through setting various parameters on the wire bonder performing the wirebonding process of the first wire 22. In various implementations, the use of the material/portion of the leadframe/substrate may permit a stable current sensing process to be carried out because the resistance of the leadframe does not increase or substantially increase over time due to thermal cycling in comparison with the material of the emitter pad 18.

Figure 3:
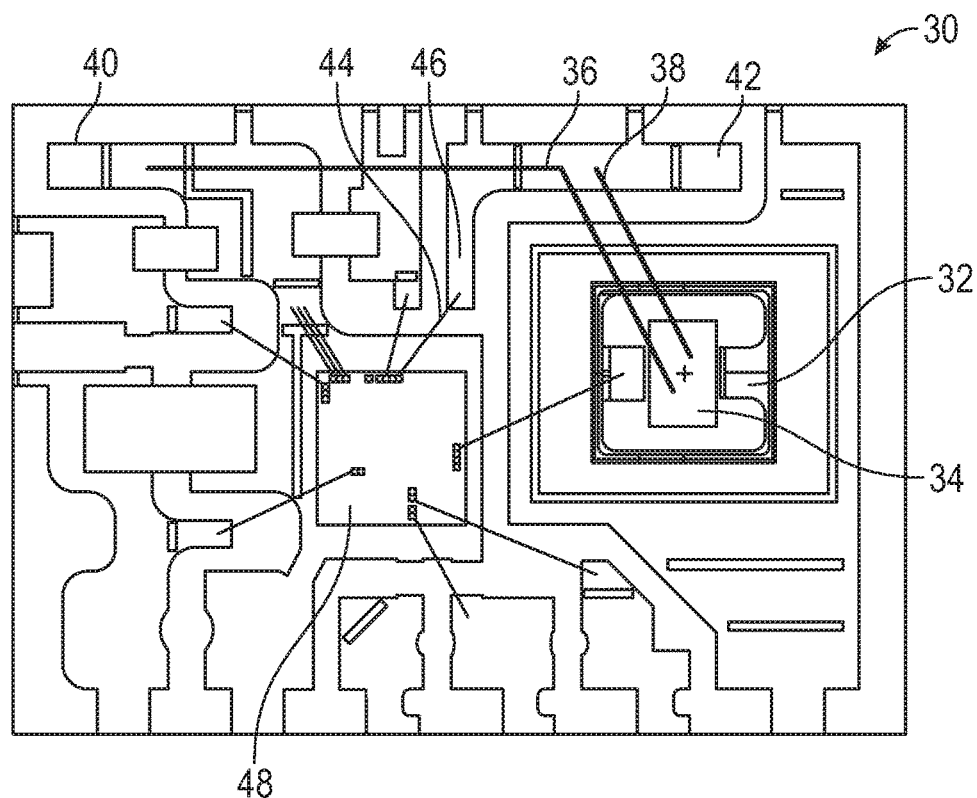
FIG. 3 is a top view of a bonding diagram of an implementation of a semiconductor package.

While in the implementation illustrated in FIG. 2, the use of a single first wire 22 is illustrated, in other implementations multiple wires may be used in addition to the first wire 22 to make the connection between the emitter pad 18 and the current sense area/leadframe 24. Referring to FIG. 3, another implementation 30 of a semiconductor package is illustrated in the form of a top down view of a bonding diagram. As illustrated, the implementation includes an IGBT 32 with an emitter pad 34 to which a first wire 36 and a third wire 38 have been bonded. As illustrated, the third wire 38 is bonded between the pad and the leadframe 42 at a location on the leadframe 42 that allows the first wire 36 to be bonded between the third wire 38 and a grounding location 40 of the package. This parallel bonding technique permits all of the current passing between the emitter pad 34 and the grounding location 40 to pass through the material of the first wire 36 between the point where the first wire 36 is bonded to the leadframe 42 and then on to the grounding location 40. The parallel bonding of the first wire 36 and the third wire 38 also permits the total current between the grounding location 40 and the emitter pad 34 to be divided between the first wire 36 and the third wire 38 after the point where both wires are bonded to the leadframe 42. In various implementations, this can be referred to as bonding the third wire 38 in parallel with a portion of the first wire 36.

In some implementations, the current may be equally divided between the first wire 36 in the third wire 38; in other implementations the current may be substantially equally divided between the first wire 36 in the third wire 38; and in yet other implementations, the current may be divided unequally between the first wire 36 and the third wire 38. Where the current is not divided equally between the first wire 36 and the third wire 38, this may be accomplished by using different wire diameter/size for the first wire 36 and for the third wire 38. As illustrated, a second wire 44 is bonded to a current sense portion 46 of the leadframe 42 to allow control IC 48 to measure the current passing through the first wire 36 and the grounding location 40.

Figure 4:
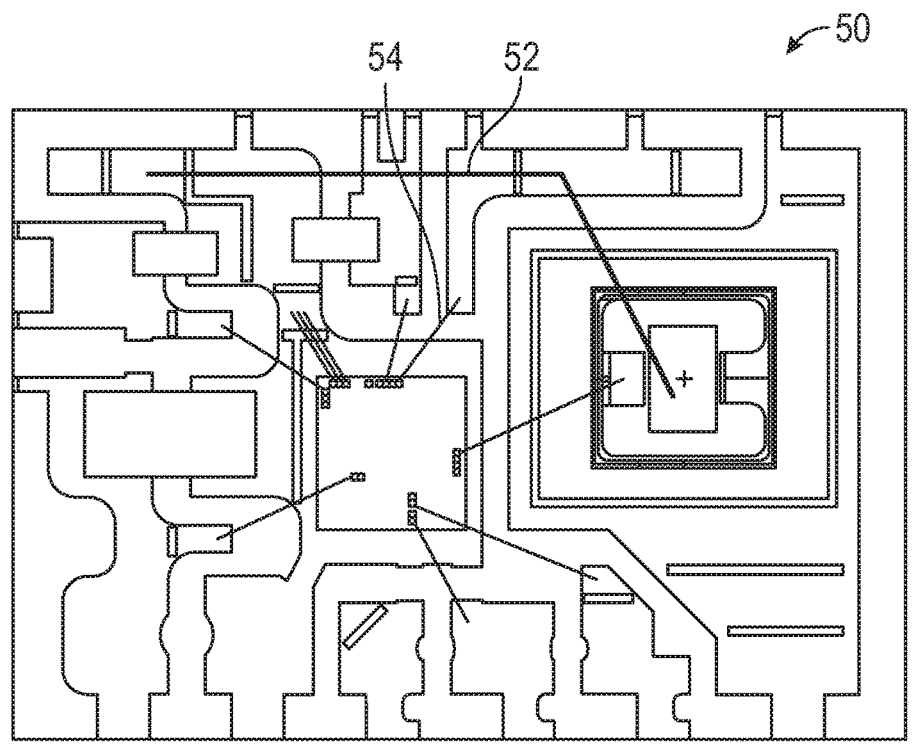
FIG. 4 is a top view of a bonding diagram of an implementation of a semiconductor package.

The effect of being able to divide the current between the first wire 36 and the third wire 38 is that the resulting junction temperature for each wire at the point where each is bonded to the emitter pad 34 is reduced because the current passing through each wire is correspondingly reduced. This has the effect in various supplementations of increasing the power cycle lifetime for the semiconductor package by increasing the time it will take for the bonds between the first wire 36 and the third wire 38 and the emitter pad 34 to fail due to the junction temperature effects previously discussed. While the use of a third wire 38 is illustrated, in various implementations one or more additional wires (a third wire and one or more additional wires) between the emitter pad 34 and the leadframe 42 may be used to further divide the current among the wires. Also in other implementations, more than one triply bonded wire between the emitter pad 34 and the grounding location 40 may be used as well. In such implementations, the portion of the leadframe 46 used for current sensing may be adjusted/positioned to accommodate the multiple wires to allow the control IC 48 and the second wire 44 to accurately measure the current. FIG. 4 illustrates a bonding diagram of a semiconductor package implementation 50 that includes just a first wire 52 and a second wire 54 similar to the block diagram version illustrated in FIG. 2. In this implementation, a third wire is not used.

In various implementations of semiconductor packages like those disclosed herein, while the use of the first wire to make an electrical connection between the emitter pad and a grounding location on a leadframe has been illustrated, the first wire may be used to make a connection to a power source instead. This power source may be a battery or other electrical power source from a motherboard, generator, or other electrical power generating system. In such implementations, the control IC now measures the amount of current flow from the power source to the semiconductor die/device/component during operation. A wide variety of semiconductor devices may be utilized in various semiconductor package implementations that utilize the principles disclosed herein, such as, by non-limiting example, metal oxide field effect transistors (MOSFETs), power semiconductor devices, diodes, silicon controlled rectifiers, thryristors, passive components, active components, or any other semiconductor device where the current to the device as desired to be measured. The ability to divide the current using multiple bond wires and a portion of the leadframe/substrate may also be employed independently from a control IC in various package implementations. In some package implementations, a control IC and a second wire may not be used, but the use of the triply bonded wire with additional bond wires may still be used to reduce the junction temperature at the bonds with the pad structure associated with the semiconductor die.

Figure 5:
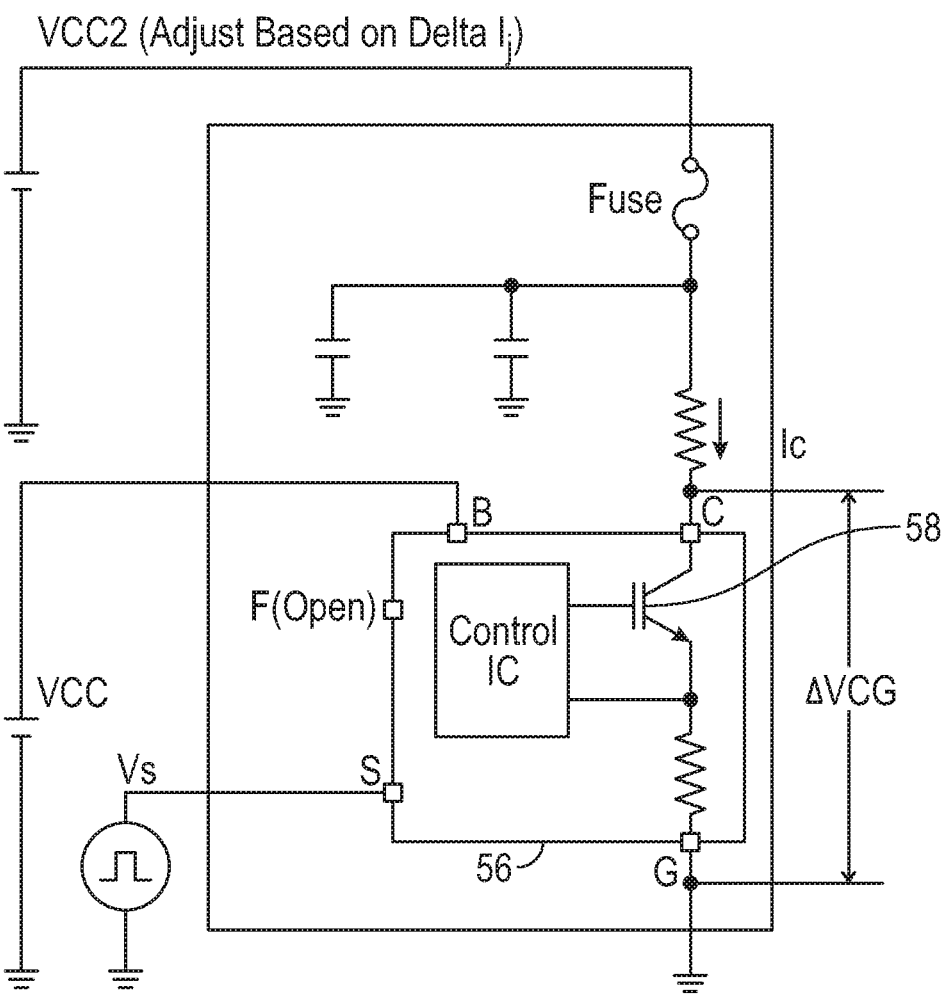
FIG. 5 is a schematic view of a test circuit for an implementation of a semiconductor package like those disclosed herein.

Testing with an implementation of a semiconductor package with a structure like that illustrated in FIG. 3 was carried out using a test circuit like that in the electrical schematic illustrated in FIG. 5. In FIG. 5, the internal electrical structure of the package 56 is illustrated surrounding by a block. As illustrated, a square wave on/off signal Vs is applied to the package 56 and the resulting voltage drop from point C to point G ($\Delta VCG$) was used along with the thermal resistance (Rth) of the IGBT 58 in the package 56 to establish and maintain a junction temperature $\Delta Tj$ at a desired value during power cycle testing using the circuit. During testing, each power cycle lasted 40 seconds with the on-time for the IGBT 58 being 30 milliseconds each cycle. The ambient temperature was maintained 25 C while the $\Delta Tj$ was maintained at a constant value during each test. Two different $\Delta Tj$ values were used during testing.

Figure 6:
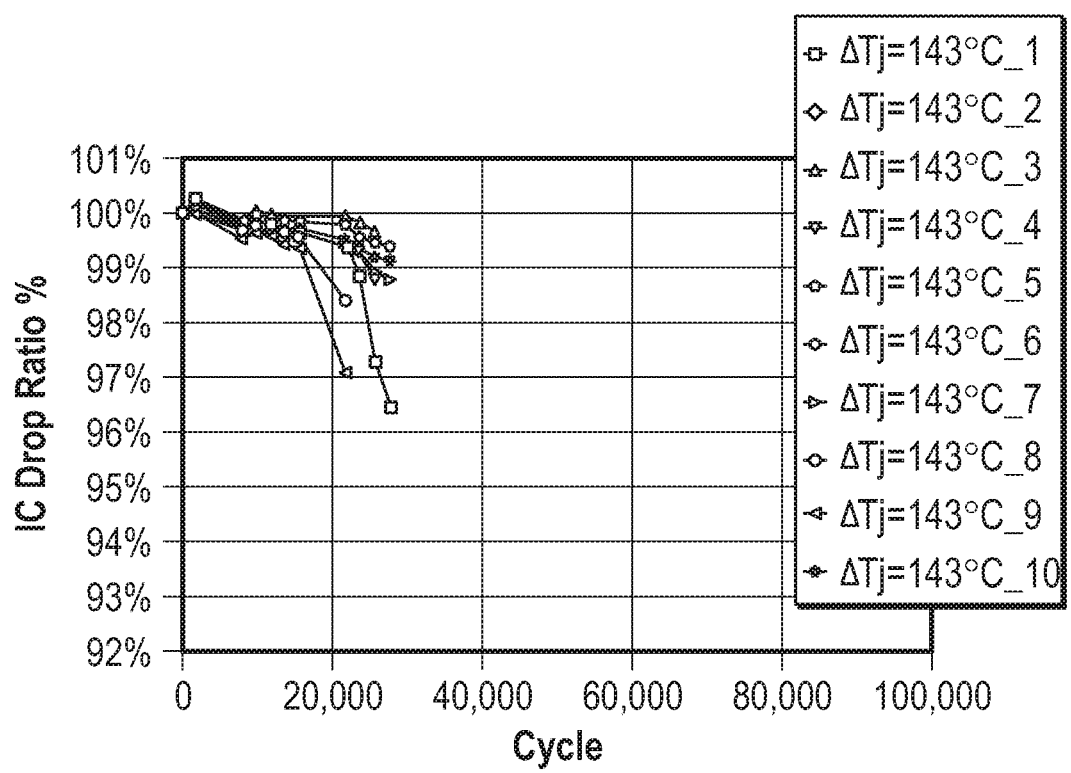
FIG. 6 is a plot of power cycle test result data for a first implementation of a semiconductor package.

Referring to FIG. 6, the results of a power cycle test after approximately 28,000 cycles using a semiconductor package with a structure like the block diagram illustrated in FIG. 1 is illustrated. As illustrated in FIG. 1, the single Wire 1 carries all the current between the emitter pad and the ground and the control IC is directly coupled to the emitter pad through Wire 2. As illustrated in FIG. 6, the $\Delta Tj$ was maintained at 143 C throughout the experiment and 10 separate packages were tested. As can be seen by inspection, at least one of the packages suffered a short of the IGBT between 21,870 cycles and 23,760 cycles. As a result of the tests, testing of the remaining units ceased at 27,540 cycles. The shorting of the IGBTs observed during the testing was the result of the two issues previously discussed, where the breakdown of the material of the emitter pad caused the IGBT to fail and the control IC's ability to monitor the current grew increasingly compromised as the test continued. Testing was also done using 10 other packages like the one illustrated in FIG. 1 at a $\Delta Tj$ of 126 C out to 90,990 cycles and IGBT shorts were observed to begin to occur between 37,530 cycles and 39,420 cycles notwithstanding the lower temperature.

Figure 7:
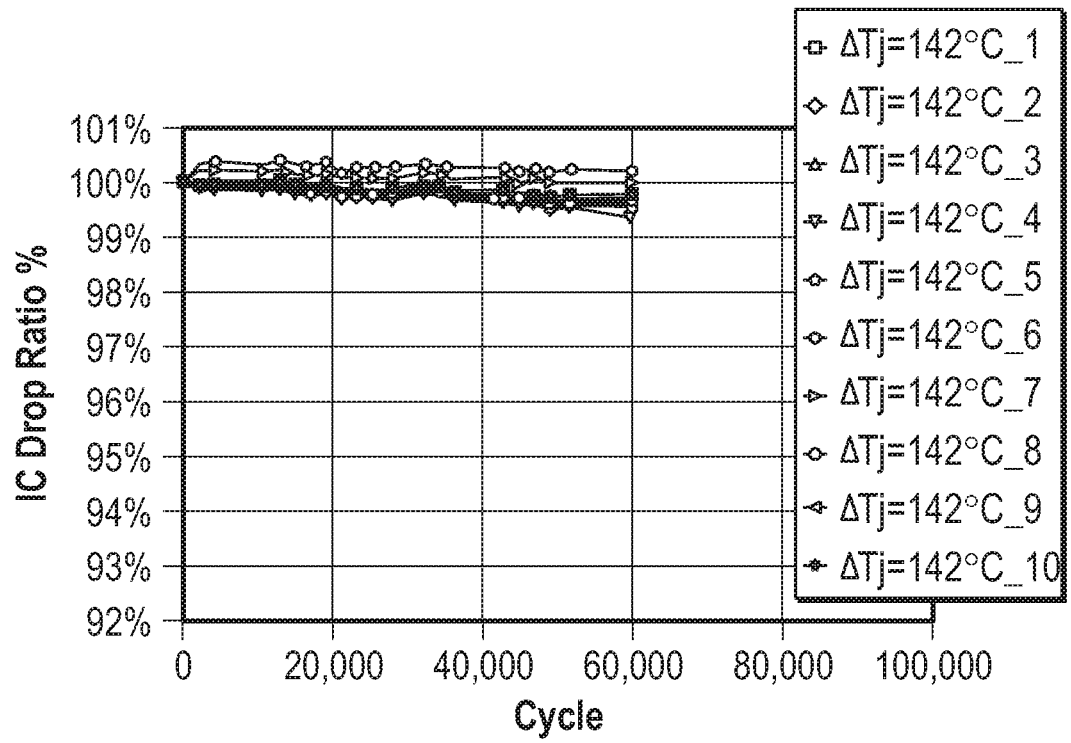
FIG. 7 is a plot of power cycle test result data for a second implementation of a semiconductor package.

Referring to FIG. 7, test results from a semiconductor packages with a structure like that illustrated in FIG. 3 are illustrated collected using the test circuit of FIG. 5 with a similar junction temperature of 142 C. As illustrated, the tests were run all the way out to 60,000 cycles with zero failures observed resulting in a product lifetime 2.5 times longer than the package implementations used in the data of FIG. 6. This result was unexpectedly good given the testing was done under essentially the same conditions. Another test was also run with a junction temperature of 126 C out to 60,000 cycles without any failures indicating a packages had be lifetime 1.5 times greater than the packages tested both FIG. 6, also an unexpectedly good result.

These testing results indicate that the use of a first wire and third wire along with doing current sensing on the leadframe for the control IC greatly lengthens the lifetime of the IGBT device. This effect was observed without making any changes to the IGBT device itself or using any better thermal management solutions. Because of this, the total volume of the package can be minimized because a heat sink may not need to be employed to keep the package at a lower temperature to make junction temperature damage to the bond pad occur slowly as possible. The observed improvements and product lifetime due to lowering of the junction temperatures during operation may also permit the package dimension to remain the same even while a higher current load/power is handled by the package.

In various implementations, the material of the first wire and third wire may be aluminum and the material of the second wire may be gold. However, a wide variety of material types may be employed for the first wire, third wire, and for the second wire and they may be made of any electrically conductive material or alloy in various implementations. In some implementations the material of the third wire may be different from the material of the first wire. The material used with the leadframe may be any electrically conductive material capable of be formed into a leadframe such as, by non-the video example, copper, aluminum, copper alloys, aluminum alloys, any combination thereof, or any other electrically conductive material. A wide variety of material types may be selected using the principles disclosed herein.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A semiconductor package system comprising:

a first bond wire bonded to a portion of a leadframe and to a pad of a semiconductor die, the first bond wire coupled to one of a power source or a ground;

a second bond wire bonded to the portion of the leadframe and to a control integrated circuit; and a third bond wire bonded to the portion of the leadframe and to the pad;

wherein the portion of the leadframe forms a current sense area; and wherein the control integrated circuit is configured to use the second bond wire and the current sense area to measure a current flowing through the first bond wire during operation.

2. The system of claim 1, wherein the semiconductor die is an insulated gate bipolar transistor.

3. The system of claim 1, wherein the first bond wire comprises aluminum.

4. The system of claim 1, wherein the first bond wire is bonded at three locations.

5. The system of claim 1, wherein the third bond wire comprises aluminum.

6. The system of claim 1, wherein a junction temperature between the pad and the first bond wire and the third bond wire is reduced by dividing the total current with the first bond wire and the third bond wire.

7. A semiconductor package system comprising:

a first bond wire bonded to a portion of a substrate and to a pad of a semiconductor die, the first bond wire coupled to one of a power source or a ground;

a second bond wire bonded to the portion of the substrate and configured to be bonded to a control integrated circuit; and a third bond wire bonded to the portion of the substrate and to the pad;

wherein the portion of the substrate forms a current sense area configured to allow the control integrated circuit to use the second bond wire and the current sense area to measure a current flowing through the first bond wire during operation.

8. The system of claim 7, wherein the semiconductor die is an insulated gate bipolar transistor.

9. The system of claim 7, wherein the first bond wire comprises aluminum.

10. The system of claim 7, wherein the first bond wire is bonded at three locations.

11. The system of claim 7, wherein the third bond wire comprises aluminum.

12. The system of claim 7, wherein a junction temperature between the pad and the first bond wire and the third bond wire is reduced by dividing the total current with the first bond wire and the third bond wire.

13. A method of current sensing in a semiconductor package, the method comprising:

bonding a first bond wire to a portion of one of a substrate or a leadframe, to a pad of a semiconductor die and to one of a power source or a ground;

bonding a second bond wire to the portion of the one of the substrate or the leadframe and to a control integrated circuit;

bonding a third bond wire to the portion of one of the substrate or the leadframe and to the pad; and measuring a current flowing through the first bond wire using the control integrated circuit, the second bond wire, and the portion of one of the substrate or the leadframe.

14. The method of claim 13, wherein the semiconductor die is an insulated gate bipolar transistor.

15. The method of claim 13, wherein the first bond wire and the third bond wire comprises aluminum.

16. The method of claim 13, wherein the second bond wire comprises gold.

17. The method of claim 13, further comprising reducing a junction temperature between the pad and the first bond wire and the third bond wire by dividing the total current between the first bond wire and the third bond wire.

* * * * *